(12) United States Patent
Grube

(10) Patent No.: US 6,811,406 B2
(45) Date of Patent: Nov. 2, 2004

(54) MICROELECTRONIC SPRING WITH ADDITIONAL PROTRUDING MEMBER

(75) Inventor: Gary W. Grube, Pleasanton, CA (US)

(73) Assignee: Formfactor, Inc., Livermore, CA (US)

( * ) Notice: Subject to any disclaimer, the term of this patent is extended or adjusted under 35 U.S.C. 154(b) by 0 days.

(21) Appl. No.: 09/834,074

(22) Filed: Apr. 12, 2001

(65) Prior Publication Data

US 2002/0151194 A1 Oct. 17, 2002

(51) Int. Cl.⁷ .............................................. H01R 12/00
(52) U.S. Cl. ......................... 439/66; 439/197; 439/259
(58) Field of Search ........................... 439/862, 81, 66, 439/197, 259, 266; 324/754, 762; 174/260, 261; 361/774

(56) References Cited

U.S. PATENT DOCUMENTS

| | | | |
|---|---|---|---|
| 3,891,924 A | * | 6/1975 | Ardezzone |
| 4,220,389 A | * | 9/1980 | Schell |
| 4,370,011 A | * | 1/1983 | Suzuki et al. |
| 4,615,573 A | | 10/1986 | White et al. |
| 4,811,246 A | * | 3/1989 | Fitzgerald, Jr. |
| 4,965,865 A | * | 10/1990 | Trenary |
| 4,976,629 A | * | 12/1990 | Werner |
| 5,177,438 A | | 1/1993 | Littlebury et al. |
| 5,228,866 A | * | 7/1993 | Espenshade et al. ........ 439/266 |
| 5,286,208 A | | 2/1994 | Matsuoka |
| 5,307,311 A | * | 4/1994 | Silwa |
| 5,476,818 A | | 12/1995 | Yanof et al. |
| 5,513,430 A | | 5/1996 | Yanof et al. |
| 5,613,861 A | | 3/1997 | Smith et al. |
| 5,723,894 A | * | 3/1998 | Ueno et al. ................... 257/415 |
| 5,810,609 A | | 9/1998 | Faraci et al. |
| 5,811,982 A | | 9/1998 | Beaman et al. |
| 5,848,685 A | | 12/1998 | Smith et al. |
| 5,914,218 A | | 6/1999 | Smith et al. |
| 5,944,537 A | | 8/1999 | Smith et al. |
| 5,994,152 A | | 11/1999 | Khandros et al. |
| 6,014,032 A | | 1/2000 | Maddix et al. |
| 6,043,563 A | | 3/2000 | Eldridge et al. |
| 6,072,190 A | | 6/2000 | Watanabe et al. |
| 6,149,443 A | * | 11/2000 | Moran ......................... 439/66 |
| 6,174,744 B1 | | 1/2001 | Watanabe et al. |
| 6,184,576 B1 | | 2/2001 | Jones et al. |
| 6,229,100 B1 | * | 5/2001 | Fjelstad ....................... 174/261 |
| 6,307,392 B1 | | 10/2001 | Soejima et al. |
| 6,344,752 B1 | * | 2/2002 | Hagihara et al. ........... 324/754 |
| 2001/0012739 A1 | | 8/2001 | Grube et al. |

FOREIGN PATENT DOCUMENTS

| | | | |
|---|---|---|---|
| JP | 64-047090 | | 2/1989 |
| JP | 4-214650 | * | 8/1992 |
| JP | 5-198716 | | 8/1993 |
| JP | 7-021968 | | 1/1995 |
| JP | 07-063999 | | 3/1995 |
| WO | WO 97/43653 | | 11/1997 |
| WO | WO 97/44676 | | 11/1997 |

* cited by examiner

*Primary Examiner*—Neil Abrams
(74) *Attorney, Agent, or Firm*—O'Melveny & Myers LLP; Ken Burraston

(57) ABSTRACT

Various structural features for modifying the performance characteristic of cantilevered microelectronic spring structures are disclosed. Generally, the features comprise a protruding member mounted between a supporting substrate and the transverse cantilever beam of a microelectronic spring structure, at a distance spaced apart from the supporting structure from which the beam is cantilevered. The protruding member may be equal to the clearance under the beam, less than the clearance under the beam, or adjustable in height; and may be attached or mounted to either the beam or the substrate. The protruding member may include an adjustable pressure device or an electronic element. The protruding member may induce a reverse wipe.

49 Claims, 8 Drawing Sheets

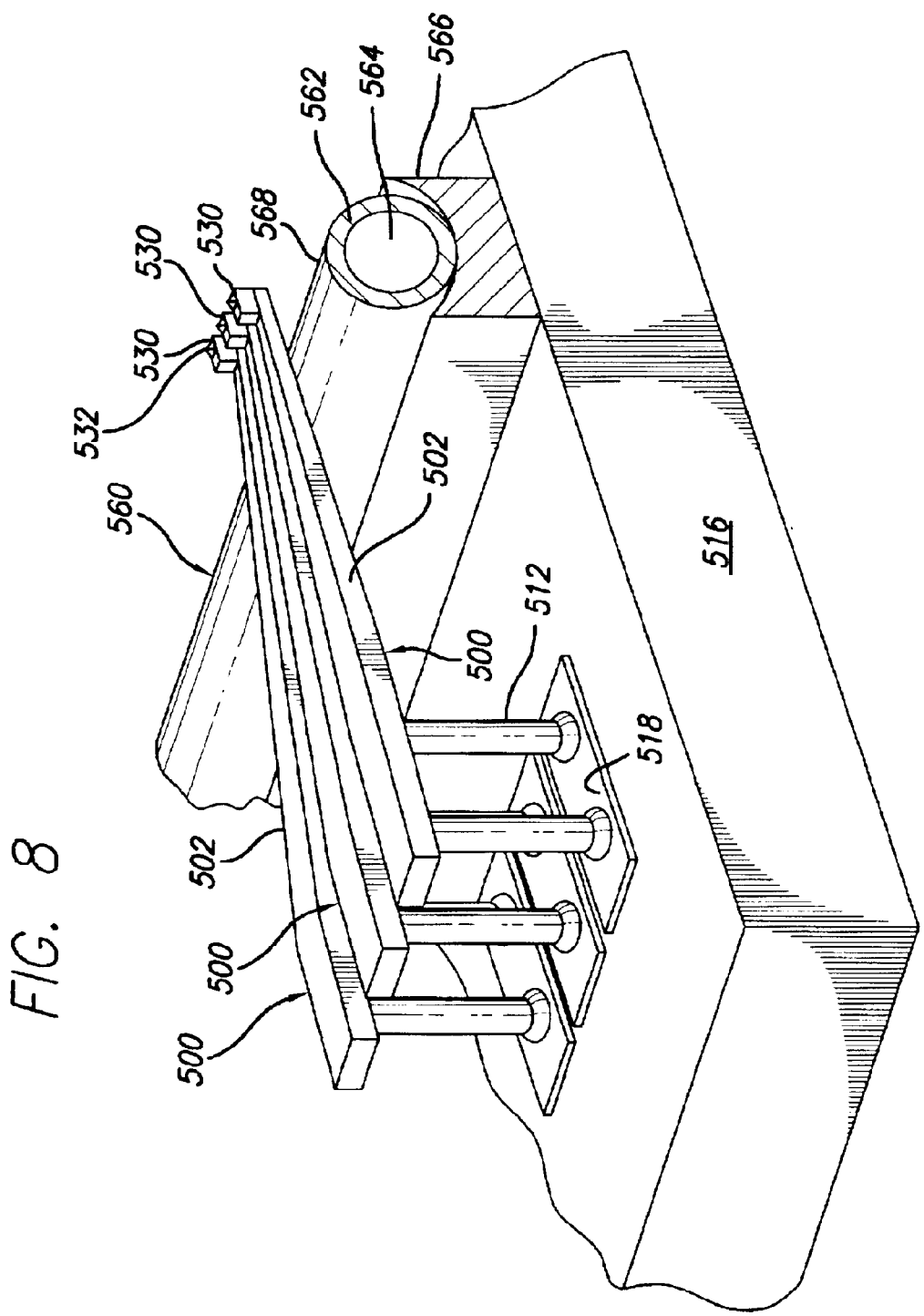

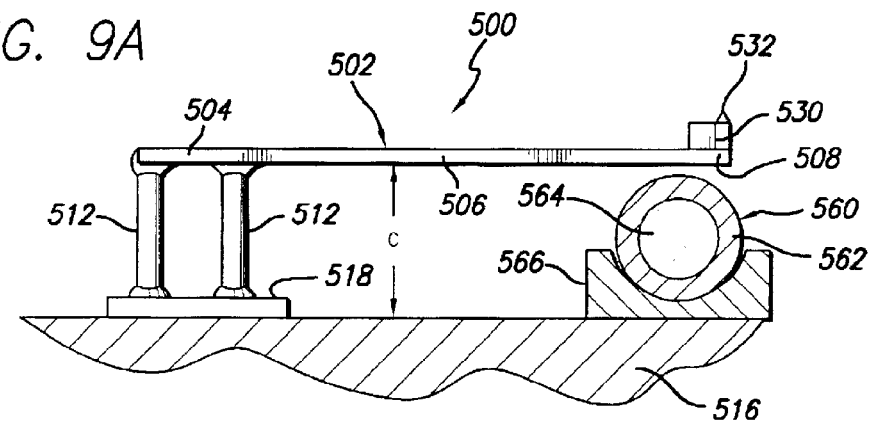
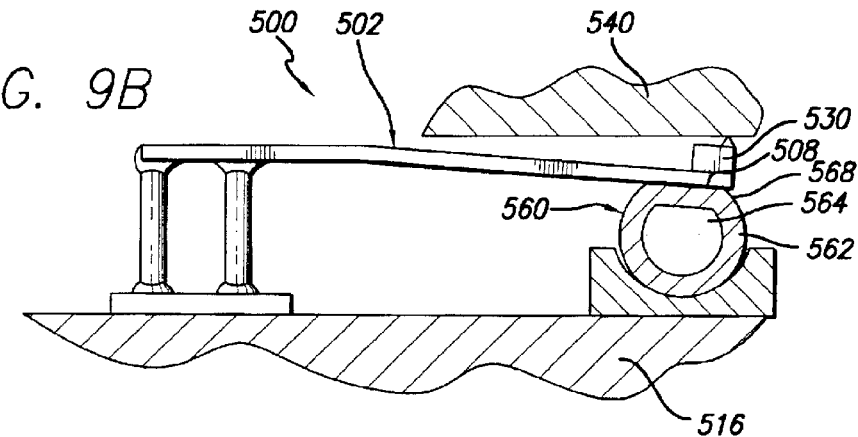
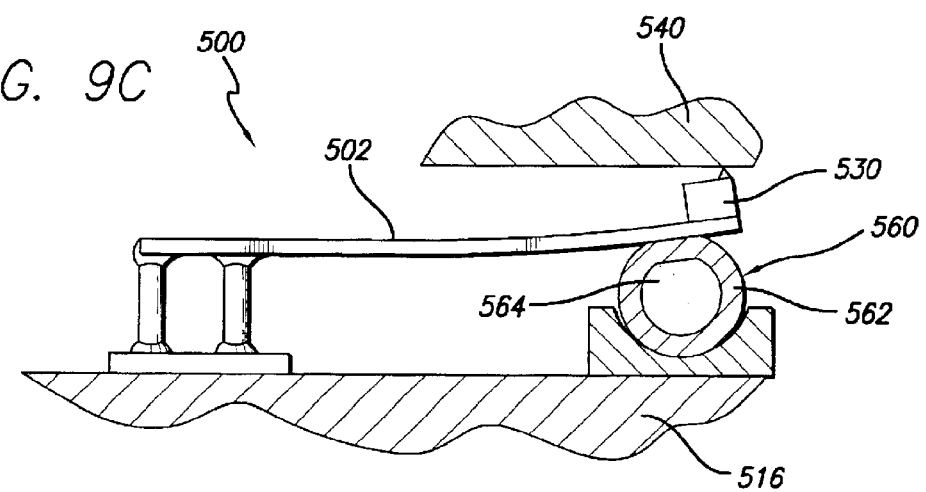

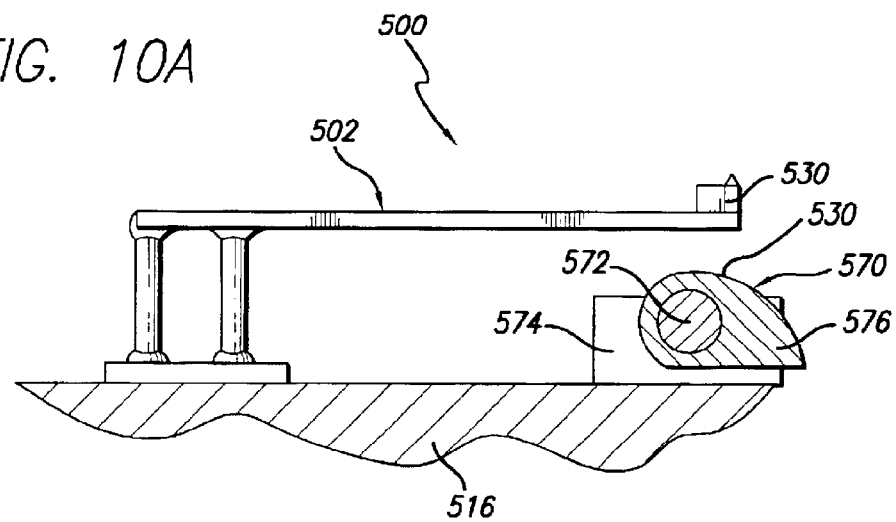
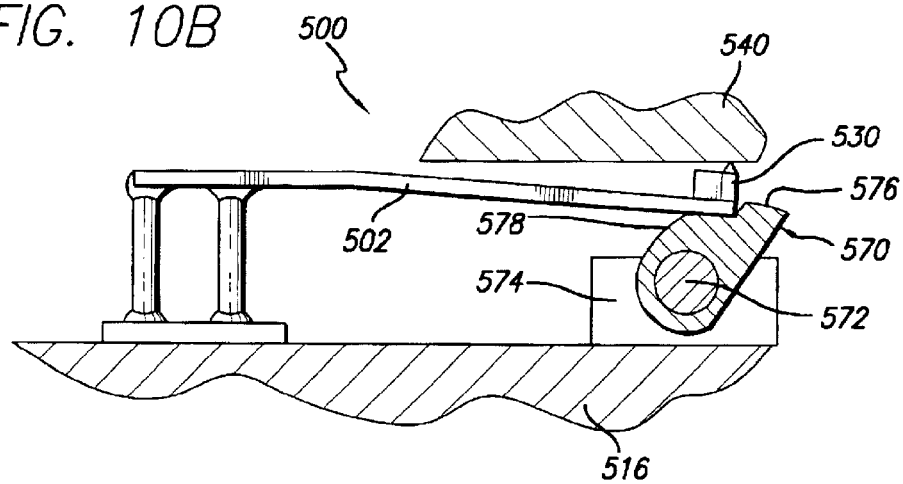

MICROELECTRONIC SPRING WITH ADDITIONAL PROTRUDING MEMBER

BACKGROUND OF THE INVENTION

1. Field of the Invention

The present invention relates to electrical interconnection (contact) elements and, more particularly, to contact elements which are resilient contact elements suitable for effecting readily demountable pressure connections between substrates, such as electronic components.

2. Description of Related Art

Readily demountable interconnections between electronic components include resilient contacts of one electronic component being received by another electronic component at, for example, pads or sockets. The spring contacts exert a contact force (optionally, with a wiping action) on the pad elements in an amount sufficient to ensure a reliable electrical connection. Resilient spring contacts or structures intended to make pressure contact with an electronic component, or other substrate, are referred to herein as "spring contacts." Elements that are sized for direct demountable connection to semiconductor devices, such as semiconductor dice or wafers, are referred to as "microelectronic" springs, spring contacts, or spring structures.

Prior art techniques for making spring contacts generally involve stamping or etching a sheet of spring material, such as phosphor bronze, beryllium copper, steel or a nickel-iron-cobalt (e.g., kovar) alloy, to form individual spring contacts, shaping the spring contacts to have a spring shape, optionally plating the spring contacts with a good contact material (e.g., a noble metal such as gold, which will exhibit low contact resistance when contacting a like material), and forming a plurality of such shaped, plated spring contacts into an array pattern. However, such techniques are not well suited for meeting the design requirements described below.

Stringent design requirements apply to microelectronic spring contacts. Generally, a certain minimum contact force is desired to achieve reliable electrical contact to electronic components. For example, a contact force of approximately 15 grams (including as little as 2 grams or less and as much as 150 grams or more, per contact) may be desired to ensure that a reliable electrical connection is made to a terminal of an electronic component. Such terminals are often contaminated with organic films, corrosion, or oxides on their contact surfaces, and the tip of the spring contact must be applied with sufficient force to penetrate this barrier of contamination. Additionally, it is preferable for the tip of a spring contact to move in a direction parallel to the surface of the connecting terminal when it is depressed in a "z" direction (i.e., perpendicular to the terminal surface), thereby providing "wipe," which is useful for clearing contamination and ensuring a good connection. The tip should be disposed sufficiently above the substrate to which it is attached (i.e., the spring should have adequate "z-extension") to ensure that an electrical connection can be made without interfering with components, such as capacitors, which may be mounted to a surface of the components to be connected.

For any spring contact, the modulus of elasticity of the spring material in combination with the shape and size of the resilient working portion of the spring should be such that the spring contact reliably provides the minimum contact force needed to ensure debris removal and an electrical connection. Application and manufacturing considerations also constrain spring shape and size. When spring contacts are fabricated at ever-smaller microelectronic scales, it becomes increasingly difficult to fulfill these and other design requirements.

Various microelectronic spring contact structures have been developed for addressing the foregoing design requirements. Although a few of the prior art structures provide the desired combination of adequate z-extension and contact force, a shaped tip, and wiping action at the desired microelectronic scales, there remains an opportunity to improve upon the performance of these structures, and to extend their range of applicability, as disclosed herein.

SUMMARY OF THE INVENTION

The commonly-owned, co-pending application Ser. No. 09/746,716, filed Dec. 22, 2000, which is incorporated herein by reference, in its entirety, discloses a microelectronic spring structure comprising a group of column elements, a cantilevered beam secured transverse to the group of column elements, and a contact tip on a portion of the cantilevered beam distal from the column elements. In particular, Ser. No. 09/746,716 discloses column elements that are formed from a relatively soft wire core (such as a gold core) bonded to a substrate, and coated with a resilient structural material, (such as by plating the core with a nickel or nickel alloy layer). The resulting column elements, especially configured as a group of two or more columns, provide a relatively rigid and stable base for a cantilever beam element. Among other things, the column elements disclosed in Ser. No. 09/746,716 are used to space the cantilever beam apart from the substrate (i.e., provide high clearance for the beam). Column elements comprised of plated and ball-bonded wire are particularly useful for readily providing a relatively high beam clearance. Such cantilever beam-type spring structures, i.e., those with a relatively high beam clearance, are completely new to the field of microelectronic spring structures, insofar as they are structures that may be mass-produced cost-effectively, and correspondingly create opportunities for new improvements in the field, such as described herein.

The present invention improves upon cantilever beam-type microelectronic spring structures by providing additional structural features that modify the performance characteristics of the spring structures in useful ways. The additional features are especially suitable for use in structures having a relatively high beam clearance, for example, spring structures with column elements as described in Ser. No. 09/746,716 referenced above. However, the invention is not limited to such structures, and may be used with any microelectronic spring structure having enough beam clearance to accommodate the features described herein.

The added features provided by the present invention may be generally described as a protruding member mounted between the supporting substrate and the transverse cantilever beam of a microelectronic spring structure, at a distance spaced apart from the primary column elements (or equivalent structure) from which the beam is cantilevered. In embodiments of the invention, the height of the protruding member may be equal to the clearance under the beam, less than the clearance under the beam, or adjustable in height. In an embodiment of the invention, the protruding member is substantially rigid and incompressible. In an alternative embodiment, the protruding member is substantially "soft" and compressible. The protruding member may be comprised of a simple structural component, such as a beam, peg, cushion, or post; or may be comprised of a multi-component assembly, such as a truss or mechanical actuator.

Additionally, the protruding member may be attached to both the substrate and the beam; attached to the substrate only; or attached to the beam only. These characteristics are combined in specific embodiments of the invention, as summarized below.

In an embodiment of the invention, the protruding member comprises a relatively rigid, incompressible post that is mounted to the substrate underneath the cantilever beam, at a position intermediate between a fixed end of the beam and its free end. In this embodiment, the post is shorter than the beam clearance. The post is positioned such that when the free end of the beam is deflected a desired distance towards the substrate (such as by contact with a mating electronic component), the beam contacts the top of the post. The post can be configured to act purely as a mechanical element, for increasing the contact force exerted at the free end of the beam. Alternatively, or in addition, the post can act as a component of an electrical switch that is activated when contacted by the beam. In a variation of this embodiment, the post is mounted to the underside of the beam, and is spaced apart from the substrate when the beam is in an undeflected position. As the beam is deflected, the post contacts the substrate, again serving as a mechanical element, an electrical element, or both. A protruding member mounted to the beam can optionally be configured to provide a reverse wiping action at a contact tip of the spring structure.

In an alternative embodiment, the protruding member comprises an electronic device, such as a capacitor. In this embodiment, the beam preferably extends from its support structure in at least two different directions. In one direction, the beam is cantilevered, and preferably has a contact tip located adjacent to its free end, for contacting the terminal of another electronic component, such as a semiconductor device. In a second direction, the beam is connected to the electronic device, which is in turn connected to a terminal on the substrate. Less preferably, the electronic device is connected to the beam at some other position, such as intermediate between the free end of the beam and the beam's support structure.

In yet another embodiment, the protruding member is resilient and substantially compressible, comprising a compressible member or assembly, such as an elastic membrane or bellows enclosing a fluid. When the contact tip of the spring structure is deflected towards the substrate, the compressible assembly contacts the beam and exerts an upward force on the beam in proportion to the degree of compression. In an embodiment of the invention, the degree of compression of the compressible assembly (and hence, the force exerted by it) partially depends on the pressure of a fluid enclosed within it. The fluid pressure is optionally controlled by a fluid control device, such as a pump or cylinder, connected to the device. The adjustable pressure assembly is configured so that it can be expanded to press against the underside of the beam when the contact tip of the beam is adjacent to or contacting an electronic component. Thus, the adjustable pressure assembly can be used to provide or supplement the contact force exerted by the spring structure. Various alternative assemblies for performing this function are additionally disclosed herein.

A more complete understanding of the microelectronic spring structure with an additional protruding feature will be afforded to those skilled in the art, as well as a realization of additional advantages and objects thereof, by a consideration of the following detailed description of the preferred embodiment. Reference will be made to the appended sheets of drawings, which will first be described briefly.

BRIEF DESCRIPTION OF THE DRAWINGS

In certain of the views presented herein, often portions of the view are presented in cross-section, for illustrative clarity, while the remainder of the figure is in side or perspective view. In general, elements in the figures are not drawn exactly to scale, and certain details may be represented schematically or omitted, for illustrative clarity.

FIG. 8 is a combined perspective and cross-sectional view of exemplary microelectronic spring structures according to the invention, wherein the protruding member comprises a reversibly compressible member, specifically a fluid-filled, elastic tube, which is shared by a plurality of structures.

FIG. 9A is a combined side and cross-sectional view of the structure shown in FIG. 8, showing a spring structure in an undeflected position.

FIG. 9B is a combined side and cross-sectional view of the structure shown in FIG. 9A, showing the spring structure in a deflected position.

FIG. 9C is a combined side and cross-sectional view of the structure shown in FIG. 9A, showing the spring structure in an alternative deflected position.

FIG. 10A is a is a combined side and cross-sectional view of an alternative structure for providing a compressible protruding member comprising an adjustable pressure device, showing a spring structure in an undeflected position.

FIG. 10B is a combined side and cross-sectional view of the structure shown in FIG. 10A, showing the spring structure in a deflected position

DETAILED DESCRIPTION OF THE PREFERRED EMBODIMENT

The present invention satisfies the need for a microelectronic spring structure, and particularly, a lithographic type microelectronic spring structure, that improves upon prior art spring structures. In the detailed description that follows, like element numerals are used to describe like elements illustrated in one or more figures.

The present invention provides features and improvements that may be adapted for use on a wide variety of different types of contact structures. In particular, the present invention may be adapted for use on composite lithographic/column type spring contacts, such as are disclosed in Ser. No. 09/746,716, referenced above. Such springs comprise a lithographically deposited post component in lieu of the column elements of the present invention, with beam and tip components similar to those disclosed herein.

Additional examples of suitable microelectronic spring contacts for use with the present invention, and methods for making such contacts, are provided, e.g., by commonly-owned, co-pending applications Ser. No. 09/023,859, filed Feb. 13, 1998, Ser. No. 09/364,788, filed Jul. 30, 1999, and Ser. No. 09/710,539, filed Nov. 9, 2000, all of which applications are incorporated herein, in their entirety, by reference. These applications disclose methods, and the resulting spring structures, for making a microelectronic spring structure by depositing (such as by electroplating) a resilient material in an integrated, patterned layer over a contoured sacrificial layer, and then removing the sacrificial layer. The sacrificial layer is shaped to have a sloped or contoured region extending above and away from the substrate, such as by impressing a moldable (plastic) layer using a specially shaped forming tool to form a spring mold. A portion of the spring mold is removed to reveal the underlying substrate. A seed layer is deposited over the sacrificial layer and exposed region of the substrate, and patterned in the plan shape of the desired spring structure. The resilient layer is then plated onto the seed layer. The sacrificial layer is removed, leaving a spring structure having a base portion attached to the substrate and a contoured and/or sloped beam extending therefrom. Furthermore, to the extent that methods for making the features described herein are not readily apparent, they will be apparent upon review of the incorporated references.

Resilient contact structures, as known in the art, are subject to particular performance requirements, which vary in degree among applications. These requirements typically relate to contact force, wipe, clearance, contact angle, elastic range, z-extension, repeatability, and longevity. The contact structures according to the present invention provide advantages for each of the foregoing performance areas, as is made apparent by the description that follows.

Figure 1A:
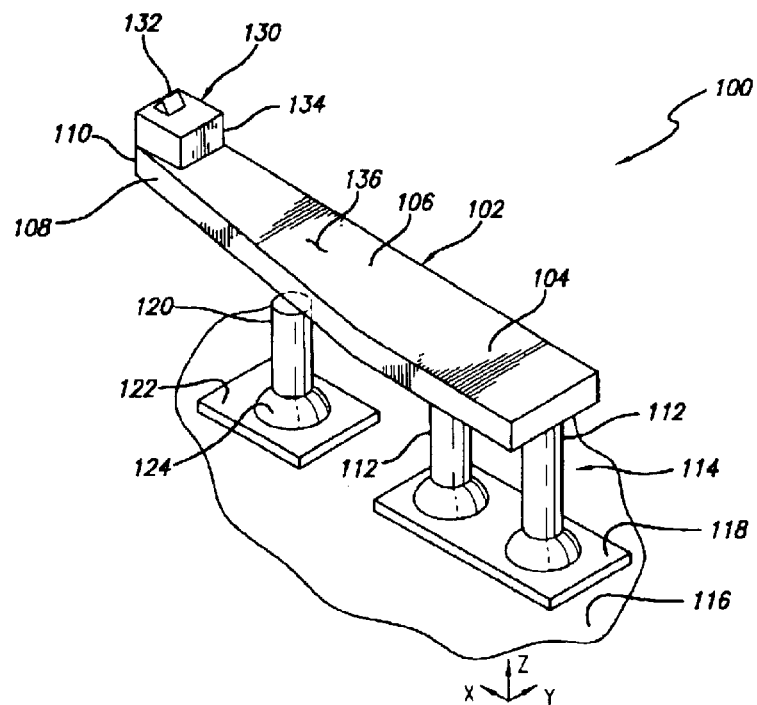
FIGS. 1A and 1B are a perspective view and a side, cross-sectional view, respectively, of a microelectronic spring structure according to the invention, having a relatively rigid, incompressible protruding member mounted to a substrate.
Figure 1B:
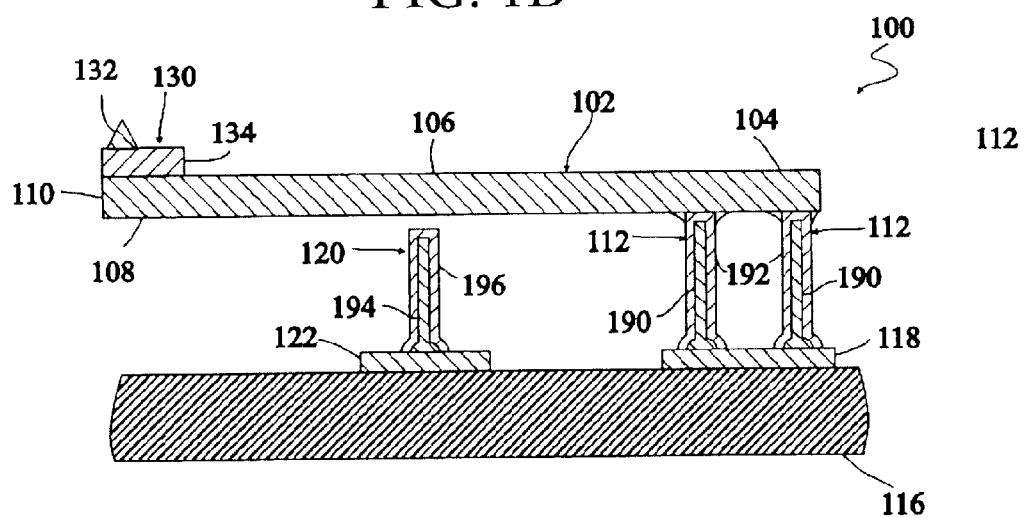

An exemplary lithographic/column composite type microelectronic spring structure 100 according to the present invention is shown in FIGS. 1A and 1B. Structure 100 comprises a beam 102 having a base portion 104, a cantilevered portion 106 extending from the base portion, a tip portion 108 adjoining the cantilevered portion, and at least one free end 110. Beam 100 is preferably formed by a lithographic process, for example, by deposition of a resilient material on a sacrificial layer or substrate as described, e.g., in Ser. No. 09/023,859 referenced above. As used herein, "sacrificial layer" refers to a material, such as a photoresist, that is deposited on a substrate during formation of a desired component or structure, such as a microelectronic spring component, and later removed from the substrate. "Sacrificial substrate" refers to a substrate that is attached to a desired component or structure, such as a microelectronic spring component, during its formation, and later removed from the component or structure.

The base portion 104 of beam 102 is secured to substrate 116 by column elements 112, comprising a group of column elements 114. Substrate 116 typically comprises a probe card, or other printed circuit board; a semiconductor device, such as a silicon chip or wafer; a ceramic material, or an electrical connector. Column elements are typically attached to a terminal 118 of substrate 116, which is in turn connected to a circuit element of an electronic component, such as, for example, an interconnect or interposer substrate, a semiconductor wafer or die, a production or test interconnect socket; a ceramic or plastic semiconductor package, or chip carrier.

Any number of column elements 112, typically less than five column elements, or a single column element, may be used to secure the base portion 104 of beam 102 to substrate 116. In an embodiment of the invention, the column elements comprise a wire core 190 that is ball-bonded to substrate 116, and covered (preferably by electroplating) with a shell 19 of structural material. In the alternative, one or more post components built by a lithographic process may be used instead of the group of plated wire column elements. As used herein, "post component" generally refers to a single column element, group of column elements, or similar structure for elevating and securing beam 102 above and to substrate 116, whether comprised of a wire element, a material built by lithographic process, or some other material. Like beam 102, column elements 112 (or other post component) are typically comprised of a metallic material and are electrically conductive.

Beam 102 is optionally provided with a tip structure 130, typically located at a tip portion 108 adjacent to the free end 110 of beam 102. In an embodiment of the invention, tip structure 130 comprises a contact tip 132 mounted to a stand-off 134. Stand-off 134 is used to elevate contact tip 132 above the upper surface 136 of beam 102, so that the contact tip 132 can contact a face of a mating electronic component, which is typically substantially planar and parallel to substrate 116, before any other part of structure 100. In an alternative embodiment, such as when beam 102 is sloped away from column elements 112 and substrate 116, tip structure 130 comprises contact tip 132 without stand-off 134. For both embodiments, tip structure 130 is preferably formed by depositing one or more layers of metallic material on a sacrificial substrate. Further details of structure 100 (with the exception of protruding member 120 described below) are as disclosed in Ser. No. 09/746,716, referenced above Structure 100 additionally includes a protruding member 120 disposed underneath beam 106. In the embodiment shown in FIGS. 1A and 1B, protruding member 120 comprises a substantially rigid and incompressible elongate member having two ends, and is mounted at one of its ends to substrate 116 and second terminal 122. It should be understood that second terminal 122 does not necessarily need to be separate from terminal 118 and may, in fact, be formed as a part of terminal 118. Protruding member 120 is preferably formed in the same way and at the same time as column elements 112. However, protruding member 120 is preferably shorter than column elements 112, and in any case, does not contact beam 106 when structure 100 is in an undeflected position, as shown in FIGS. 1A and 1B. It is particularly advantageous to form each of the column elements 112 and protruding member 120 by ball-bonding a segment of wire 190, 194 to each respective terminal 118, 122 and then plating the wire core with a structural material 192, 196. The length of protruding member 120 is then readily controlled by cutting its wire core 194 shorter than the cores 190 for column elements 112, during a wire bonding step.

Figure 2A:
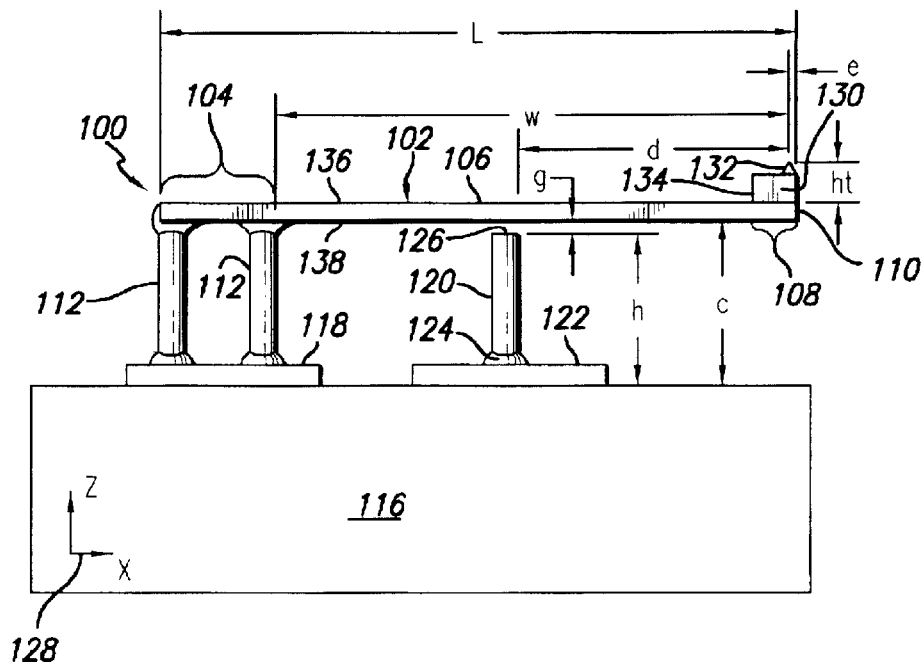
FIGS. 2A–2B are side views of an exemplary microelectronic spring structure according to the invention, in an undeflected position, and a deflected position, respectively.
Figure 2B:
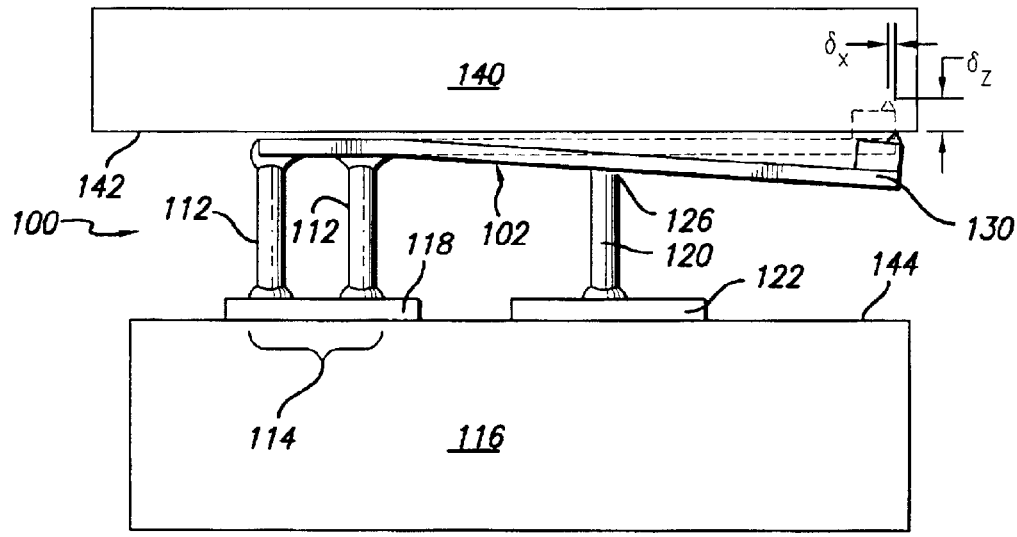

For illustrative purposes, a system of coordinate axes is shown in FIG. 1A, indicating the directions of the "x," "y," and "z" axes generally used herein for describing the structures according to the invention. The "z" axis is perpendicular to the substrate, and the "x" and "y" axes are in a plane parallel to a surface of the substrate, with "x" chosen in the direction of the elongate beam 106. FIGS. 2A and 2B show a side view of the structure shown in FIG. 1A, looking in the direction of the "y" axis.

FIG. 2A shows microelectronic spring structure 100 in an undeflected position. Beam 102 has a total length "L," and a cantilevered working length "w" between contact tip 132 and base portion 104. Protruding member 120 is mounted to terminal 122 and substrate 116, and is disposed under beam 120 a distance "d" away from contact tip 132. The uppermost portion of contact tip 132 is disposed at a height "$h_t$" above an upper surface 136 of beam 102, and an excess distance "e" away from the free end 110 of beam 102. In an embodiment of the invention, working length "w" is at least about half as long as total length "L," and more preferably at least about three-quarters as long; distance "d" is preferably between about one-quarter to three-quarters as long as working length "w". Excess "e" is generally relatively small compared to total length "L" in embodiments having the contact tip 132 near the distal end of beam 102. In alternative embodiments, it may be desirable to locate the contact tip 132 such that excess "e" is larger than the excess shown in FIG. 2A, as further described below in connection with FIGS. 2D and 3.

Tip structure 130 is mounted to tip portion 108 of beam 102. Lower surface 138 of beam 102 is substantially parallel to and disposed above substrate 116 at clearance height "c." The top 126 of protruding member 120 is positioned at a height "h" above substrate 116, where "h" is less than "c," thereby creating a gap of height "g" between protruding member 120 and beam 102. Also, tip height "$h_t$" is preferably sufficiently greater than "g" so that beam 102 will contact the top 126 of protruding member 126 before the top of contact tip 132 passes below the top surface 136 of beam 102 at base portion 104, when tip structure 130 is deflected towards substrate 116. Beam 102 is thereby free to deflect towards substrate 116, and is reversibly deflectable between an undeflected position as shown in FIG. 2A, to a deflected position as shown in FIG. 2B, wherein the protruding member 120 contacts the cantilevered portion 106 of beam 102, at a position spaced apart from tip portion 108.

Spring structure 100 is typically used for electrically connecting a substrate 116 to another electrical component, such as component 140, that has a substantially planar face 142, as shown in FIG. 2B. Tip structure 130 typically is for contacting a terminal or contact pad (not shown) on component 140. In a typical application, component 140 is advanced towards substrate 116, having its face 142 aligned with and parallel to surface 144. The top of tip structure 130 is deflected a distance "$\delta_z$" towards substrate 116, where "$\delta_z$" is less than "$h_t$" and preferably less than the elastic range of tip portion 108 in the "z" direction towards substrate 116. Tip structure 130 also moves horizontally along the surface of the mating terminal a distance "$\delta_x$" referred to as "wipe." Before protruding member 120 contacts beam 102, a contact force is exerted by spring structure 100 at tip structure 130 that is determined, among other things, by working length "w," the cross-sectional shape of beam 102, and type of material comprising beam 102. However, after protruding member 120 contacts beam 102, any further deflection in the direction of the substrate causes a substantially increased contact force at tip 130.

It should be apparent that the relative increase in the contact force at tip 130 is primarily influenced by the ratio "d"/"w", presuming that, as in the embodiment now being described, that the protruding member 120 is rigid and substantially incompressible. Therefore, the deflection characteristics of structure 100 may be determined by positioning the protruding member 120 as desired. At relatively smaller values of "d"/"w," i.e., in spring structures where the protruding member 120 is positioned close to tip structure 130, the increase in contact force is proportionally large. For example, where a rigid, substantially incompressible protruding member is positioned directly under tip structure 130, i.e., where "d" equals zero, it should be apparent that the achievable contact force at tip 130 is essentially unlimited by the structural characteristics of spring structure 100, and depends almost entirely on the load carrying capacity of protruding member 120 and the mating component 140 and substrate 116. In other words, the spring structure 100 is provided with a "hard stop." On the other hand, as the value of "d"/"w" approaches one, i.e., as the protruding member 120 is positioned closer to column elements 112, it has a diminishing influence on the contact force. Generally, a somewhat firm, but not completely hard stop is preferable for most applications, and thus it is preferable to position the protruding member 120 spaced apart from tip portion 108, such as within the range stated above.

In an embodiment of the invention, protruding member 120 is mounted to a second terminal 122 that is separate from terminal 118 to which column elements 112 are mounted. Thus, the protruding member 120 is electrically isolated from beam 120 when structure 100 is in an undeflected position. Additionally, protruding member 120 can be electrically connected to the beam 102 when in physical contact with it. In this embodiment, structure 100 may be used to switch an electrical circuit after a predetermined amount of deflection. For example, the protruding member may be used as a sensor indicating that it is safe to send electrical power through spring contact 100 to a connected electrical component. In alternative embodiments, protruding member 120 is connected to the same terminal 118 as column elements 112, or is not connected to any terminal or electrical component, and thereby serves a purely mechanical function of supporting beam 102 and influencing the deflection characteristics of structure 100.

In the embodiment shown in FIGS. 2A and 2B, the protruding member 120 is approximately perpendicular to substrate 116. Where a rigid, substantially incompressible protruding member is desired, the angle between member 120 and substrate 116 is preferably between about 80° and 110°. However, greater or lesser degrees of inclination, such as, for example, about 110° to 150°, or about 40° to 80°, may be used, particularly where a more resilient, compressible protruding member is desired. However, more inclined protruding members lead to spring structures that are more complex to model, and harder to manufacture, than the approximately perpendicular protruding members shown.

Figure 2C:
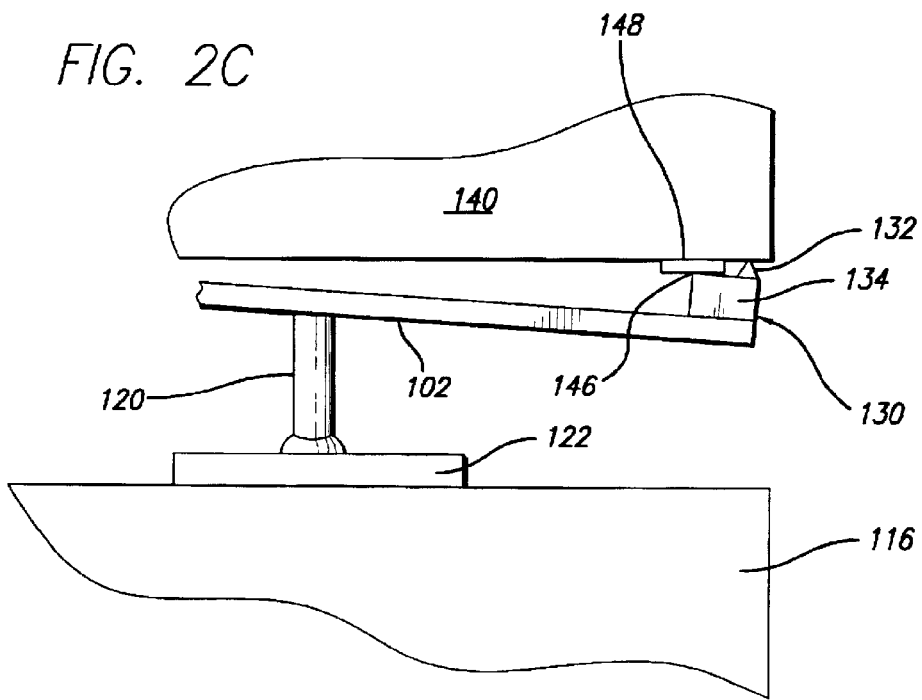
FIG. 2C is a side detail of the tip portion of a spring structure like the structure shown in FIG. 2A, showing an instance of "heel strike."
Figure 2D:
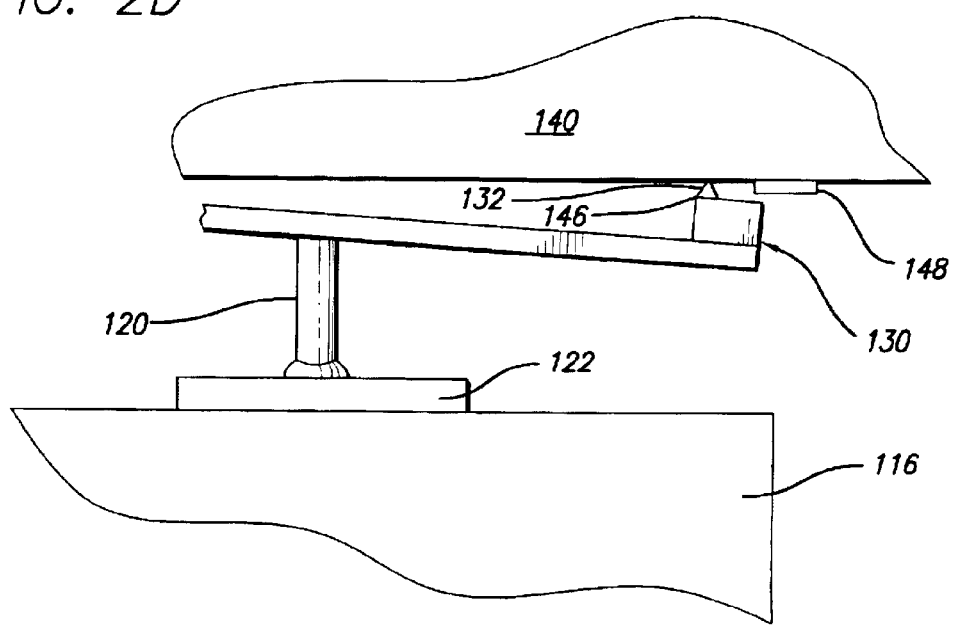
FIG. 2D is a side view of an exemplary alternative embodiment of a microelectronic spring structure for avoiding "heel strike," having a contact tip located near the heel of a stand-off.

Referring to FIG. 2C, the foregoing embodiment having the contact tip 132 located near the distal end of stand-off 134 can be subject to a phenomenon called "heel strike." The portion of stand-off 146 closest to the base portion of beam 102 is sometimes called the "heel" 146 of the stand-off. Because of the curvature of beam 102 when in a deflected position, the heel 146 may contact the electronic component 140 when the component is contacting contact tip 132, particularly if a raised area, such as raised area 148, is present on the component. Raised areas may be present by design, or may be present as a result of oxide or contaminant build-up on the surface of the component. However, contact by the heel may be undesirable because it may damage or short-circuit the component, and because it may break or degrade the electrical connection at contact tip 132. Accordingly, in an alternative embodiment, contact tip 132 may be positioned near the heel 146 of stand-off 134, as shown in FIG. 2D. This configuration of tip structure 130 avoids heel strike against mating component.

Figure 3:
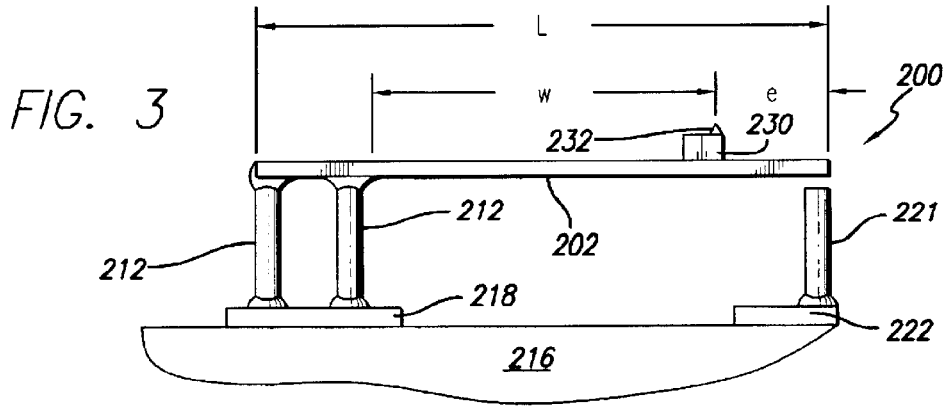
FIG. 3 is a side view of an exemplary microelectronic spring structure according to the invention, having a contact structure located on the beam in an intermediate position between the base and a protruding member near the tip of the beam.

In an alternative embodiment as shown in FIG. 3, the tip structure 230 is not located adjacent to the distal end of beam 202, but at some intermediate position where the excess "e" is substantial. Spring structure 200 exemplifies an embodiment wherein "e" is about 25% of the cantilevered beam length ("e" plus "w"). However, it should be apparent that the relative lengths of "e" and "w" are not limited by the exemplary embodiment shown in FIG. 3. Protruding member 221 of structure 200 is located adjacent to and under the distal end of beam 202, and is connected to second terminal 222 on substrate 216. Spring structure 200 is in other respects similar to spring structure 100. Structure 200 comprises, for example, beam 202, a substrate 216, column elements 212, terminals 218 and 222, and a tip structure 230, that are substantially the same as beam 102, substrate 116, column elements 112, terminals 118 and 122, and tip structure 130, respectively, described above with respect to spring structure 100. However, the position of protruding member 221 distal to the tip structure 230 causes the tip structure 230 to "reverse wipe" after the protruding member 221 contacts beam 202, when tip structure 230 is deflected towards substrate 216. Reverse wipe is useful for, among other things, ensuring that contact tip 232 does not lose contact with a mating contact pad or terminal as a result of too much forward wipe.

Figure 4A:
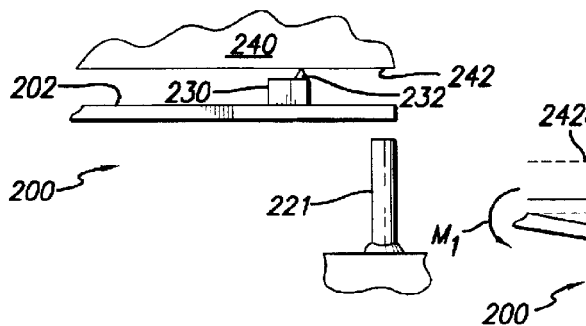
FIGS. 4A–4C are partial side views of a tip portion of the microelectronic spring structure shown in FIG. 3, showing the reverse wiping function performed by a suitably configured protruding member.
Figure 4B:
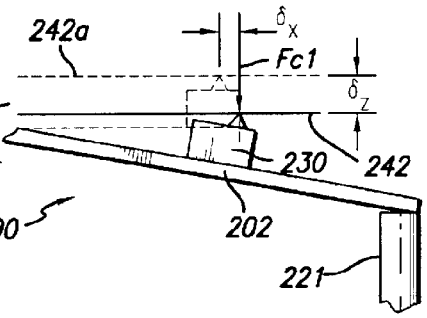
Figure 4C:
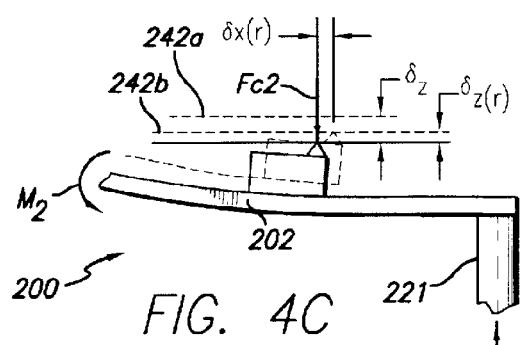

The reverse wiping action caused by the position of protruding member 221 in Restructure 200 is shown in FIGS. 4A–4C. FIG. 4A shows the tip structure 230, beam 202, and protruding member 221, at a position wherein the face 242 of a mating electronic component 240 has just made contact with tip 232. FIG. 4B shows the same structure at a position where the face 242 of the electronic component has descended a distance "$\delta_z$" toward the tip structure 230, just at the point where the protruding member 221 has first contacted the beam 202. The position of face 242 when it first contacted the contact tip 232 is shown by dashed line 242a. An amount of regular, forward wipe "$\delta_x$" as previously described, is also evident, caused by a clockwise rotation of tip structure 230 about the base of the beam 202. The tip structure 230 is subjected to a contact force "$F_{c1}$," which is counteracted by the reaction moment "$M_1$" through beam 202.

FIG. 4C shows the position of the structure 200 after further descent "$\delta_{z(r)}$" of face 242, while the protruding member 221 is in contact with substrate 216. The positions of face 242 at the positions shown in FIGS. 4A and 4B are shown by the dashed lines 242a and 242b, respectively. As the further vertical deflection "$\delta_{z(r)}$" of tip structure 230 occurs, a reaction force "$F_r$" is exerted on protruding member 221 by substrate 216, and, in turn, on beam 202, causing the tip structure 230 to rotate in a counter-clockwise direction, thereby giving rise to the reverse wipe "$\delta_{x(r)}$." The amount of reverse wipe "$\delta_{x(r)}$" is exaggerated in FIG. 4C. Generally, it is anticipated that the amount of reverse wipe will preferably be less than the preceding forward wipe "$\delta_x$," although it will be preferably greater than any further forward wipe caused by the further vertical deflection "$\delta_{z(r)}$." It should be apparent that the amount of reverse wipe may be determined by suitable configuration of the protruding member 221, for example, by appropriately selecting its length, angle of inclination to beam 202, and distance away from tip structure 230. Additionally, at the position shown in FIG. 4C, it should be apparent that the contact force will have increased to a value "$F_{c2}$" greater than "$F_{c1}$," while the reaction force "$F_r$" causes a reduction in the reaction moment through beam 202 to a value "$M_2$," which is less than "$M_1$" However, this reduction in the reaction moment, while generally beneficial because it reduces the stress in beam 202, is not essential for operation of the reverse wiping feature.

Figure 5B:
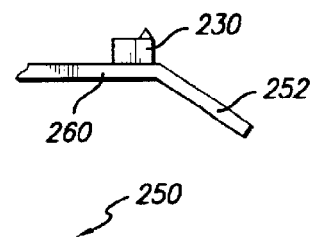
FIG. 5B is a partial side view, showing an exemplary protruding member that is integrally formed with a beam.
Figure 5A:
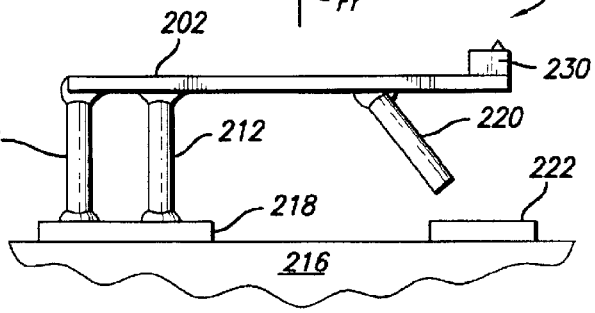
FIG. 5A is a side view of an exemplary microelectronic spring structure according to the invention, having a protruding member connected to a beam of the structure.

In an alternative embodiment, protruding member 220 is mounted to beam 202 instead of to substrate 216, as shown in FIG. 5A. In this embodiment, a gap is present between an end of member 220 and substrate 216 (or terminal 222), instead of between the protruding member and the beam, as previously described. Except for being attached to beam 202 instead of to substrate 216, and for being inclined at an acute angle with respect to beam 202 and substrate 216, protruding member 220 is substantially the same as protruding members 120 and 221. Spring structure 250 can be made to operate like spring structures 100 or 200, by suitable placement of member 220 along the beam. Embodiments having the protruding member attached to the beam may readily be manufactured by attaching the protruding member to the beam after it has been formed on a sacrificial substrate, whereby it is stabilized and has its lower surface exposed. The beam can then be aligned with and joined to the column elements as described, for example, in Ser. No. 09/746,716, referenced above.

FIG. 5B shows a tip portion of a spring structure having a beam 260 with a forwardly inclined protruding member 252 that is formed integrally with the rest of beam 260. This contrasts with protruding member 220 of structure 250 described above, which comprises a separate piece that is attached to the beam. It should be apparent that protruding member 252 can be configured to provide a reverse wiping action to tip 230, similar to that achieved by spring structure 200, if desired. In the alternative, integrally formed protruding member 252 can be configured to merely provide mechanical support, or a second electrical contact, as described above, without any appreciable reverse wiping function. In either case, a beam 250 with integral protruding member 252 may readily be formed on a sacrificial substrate using the molding and deposition methods described, for example, in the co-pending application Ser. No. 09/710,539, referenced above.

Figure 6:
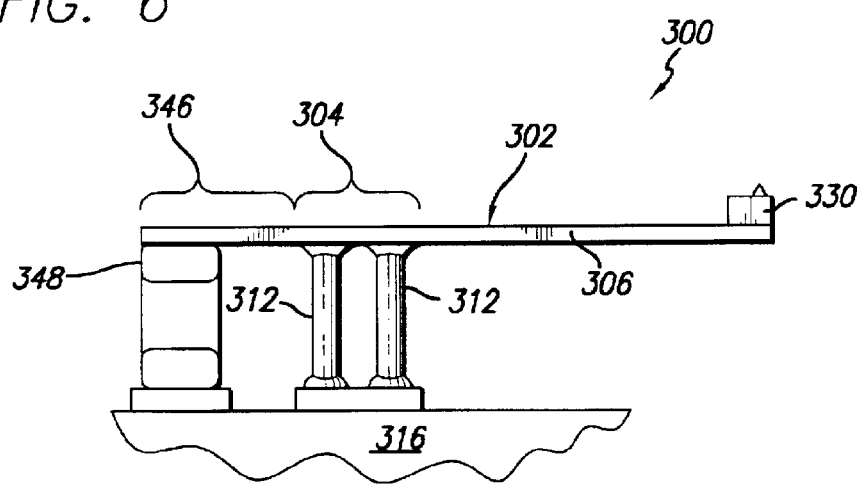
FIG. 6 is a side view of an exemplary microelectronic spring structure according to the invention, having a beam with a separately extending portion connected to an electronic device.

A protruding member may also be attached to the beam of a spring structure in a location other than the cantilever portion of the beam. FIG. 6 shows a spring structure 300 according to such an embodiment. Beam 302 of structure 300 has a separately extending portion 346 extending from the base portion 304, in a direction different from the cantilever portion 306 supporting tip structure 330. An electronic device 348 is connected to the separately extending portion 346 of beam 302. The base portion 304 is secured to substrate 316 by column elements 312, similar to the column elements 112 and 212 of spring structures 100 and 200, described above. Column elements 312 are preferably rigid and incompressible, and bear substantially all of the mechanical load on structure 300 imposed by a contact force. In this embodiment, the separately extending portion 346 bears essentially no mechanical load, and hence, the electronic device 348 can be a non-structural component. In an embodiment of the invention, device 348 is a capacitor, and the spring structure 300 is sized to provide just enough clearance between beam 302 and substrate 316 to accommodate the capacitor 348, as shown in FIG. 6. The capacitor 348 is selected to provide the structure 300 with the desired performance characteristics for a spring contact, as known in the art.

Structure 300 is optionally provided with a protruding member under the cantilevered portion of beam 302, as described above with respect to structures 100 and 200. If so, the mechanical characteristics of spring structure 300 will be substantially the same as previously described for structures 100 and 200. Alternatively, as shown in FIG. 6, no protruding member is disposed under the cantilevered portion 306 of beam 302. FIG. 6 shows the spring structure 300 in an undeflected position, wherein beam 302 is substantially free of strain. It should be apparent that structure 300 is reversibly deflectable between the undeflected position shown in FIG. 6, and a deflected position wherein the cantilevered portion is deflected towards substrate 316 by an externally applied force, such as a contact force.

Figure 7A:
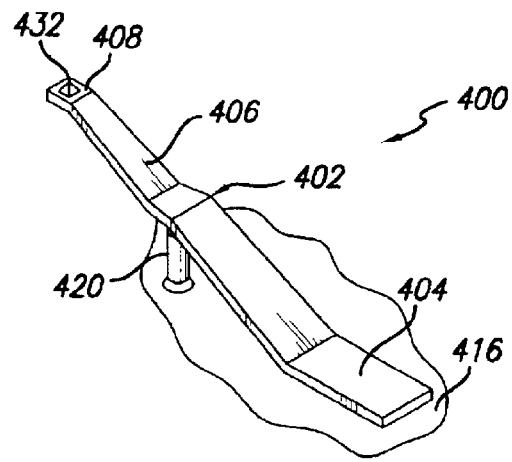
FIG. 7A is a perspective view of an exemplary microelectronic spring structure according to the invention, wherein the beam is secured to the substrate at its base portion.
Figure 7B:
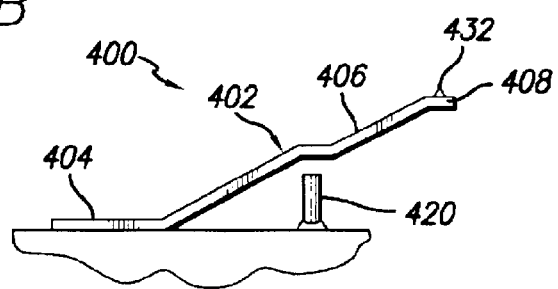
FIG. 7B is a side view of the structure shown in FIG. 7A.

FIGS. 7A and 7B show an exemplary microelectronic spring structure 400 having a sloped beam 402 that has its base portion 404 mounted directly to substrate 416 and its cantilevered portion 406 extending away from substrate 416. Protruding member 420 is mounted to substrate 416 and disposed under the cantilevered portion 406 of beam 402 spaced apart from its tip portion 408. A contact tip 432 is optionally provided on tip portion 408. FIGS. 7A and 7B show structure 400 in a undeflected position, wherein protruding member 420 does not contact beam 402. It should be apparent that structure 400 may be deflected towards substrate 416 by a contact force applied to contact tip 432, whereby the beam 402 may be brought into contact with protruding member 420. To make a microelectronic structure such as spring contact 400, having a sloped beam extending away from the substrate, the protruding member 420 is preferably first formed by a suitable process, such as by ball-bonding and plating a metal post as described above. Then, the beam 402 is preferably formed by a lithographic process, as further described, for example, in the co-pending application Ser. No. 09/710,539 referenced above. After the sacrificial layer is removed, a contact tip, such as contact tip 432, is optionally attached to tip portion 408. The sloped beam 402 may have various shapes, and may comprise contoured portions, without departing from the scope of the invention disclosed herein. Exemplary beam shapes and contours that may be adapted for use with the invention are also disclosed in Ser. No. 09/710,539 referenced above.

The protruding members 120, 220, 221, 320, and 420 described thus far are preferably substantially rigid and incompressible. If desired, protruding members may be given resiliency, for example, by making them with suitably thin cross sections, and/or by mounting them at an acute angle to the substrate or the beam. However, highly resilient protruding members are relatively complex to manufacture and test, and are thus generally not preferred. On the other hand, resilient, compressible supports for the beams of cantilevered spring structures are desirable for many applications. A simple compressible support may be provided by mounting a compressible solid material, such as a polymer foam or rubberized polymer, or other substantially compressible organic material, under the tip portion of a beam. For example, support may be provided to a plurality of aligned microelectronic spring structures by placing a rod of substantially compressible material between the substrate and the tip portions of the structures. When the tips of the spring structures are deflected towards the substrate, the underside of the beam contacts and compresses the compressible material, thus relieving stress on the beam and increasing the contact pressure at the contact tip. It is further desirable for compressible supports to supply an adjustable amount of pressure to the beam, as described below.

"Substantially compressible" is used herein to describe structural elements or assemblies that can be compressed a useful amount under the influence of a compressive force that is within the designed range of operation for the structure. A "useful amount" of compression varies depending on the application, but for the present invention, is generally at least about one-tenth of the elastic range of the subject microelectronic spring structure at its contact tip. "Substantially incompressible" is used herein to describe structural elements or assemblies that cannot be compressed a useful amount under a compressive force within the design range of the structure.

FIG. 8 shows a plurality of aligned spring structures 500, each sharing a compressible protruding member 560 disposed between the beams 502 and substrate 516. The space transformation provided by beams 502 between adjacent terminals 518 and adjacent tip structures 530 is typical, but not essential for practicing the invention. Member 560 is preferably resilient and substantially compressible, and configured to be reversibly compressible between an equilibrium state wherein no external contact force is applied to the spring contact 500, and a compressed state wherein it is compressed between the beam 502 and substrate 516, at least partially by an externally applied contact force. A cross-section through member 560 is shown at an edge of substrate 516. In an embodiment of the invention, compressible member 560 comprises a tube 568, which in turn comprises a flexible membrane 562 enclosing a fluid 564. Tube 568 is optionally mounted on a base 566. It should be apparent that a solid rod of compressible material can be substituted for tube 568, if desired. Further details of the operation of an exemplary tube 568 are shown in FIGS. 9A and 9B.

FIG. 9A shows a side view of an exemplary spring structure 500 with a compressible protruding member 560 in an undeflected position. Except for compressible member 560, spring structure 500 is similar to spring structure 100 shown in FIG. 1A, comprising a beam 502 having a cantilevered portion 506, and mounted at its base portion 504 to a substrate 516 and terminal 518, typically using columns 512. Other types of spring structures, such as structures 300 and 400 shown in FIGS. 6 and 7A, may also be adapted for use with a compressible member 560. In an embodiment of the invention, as shown in FIG. 9A, beam 502 does not contact the compressible member 560 when beam 502 is in an undeflected position. In an alternative embodiment, compressible member 560 contacts or otherwise supports beam 502, when beam is undeflected, i.e., not in contact with any electrical component at its contact tip 532. In such embodiments, member 560 may cause beam 502 to deflect a short distance away from substrate 516, and increase the initial contact force exerted at tip structure 530, prior to the application of any external contact force. In either embodiment, the compressible member 560 is preferably disposed under the tip structure 530, but may also be spaced apart from the tip portion, without departing from the scope of the invention. Member 560 is shown with a substantially circular cross-section, but it should be appreciated that non-circular cross-sections, such as oval, elliptical, square, rectangular, or polygonal are also within the scope of the invention.

FIG. 9B shows spring structure 500 in a deflected position, with its contact tip 532 in contact with an electronic component 540. Beam 502 at its tip portion 508 contacts compressible member 560, whereby contact tip 532 is provided with additional support, thereby increasing the contact force exerted by the contact tip and reducing bending stress on beam 502. Preferably, the fluid pressure of fluid 564 within tube 568 is adjustable, such as by using a rotary pump or cylinder connected to tube 568, so that compressible member 560 comprises an adjustable pressure device. Thus, when the structure 500 is in a deflected position, the contact force may be increased by increasing the fluid pressure, and may be reduced by decreasing the fluid pressure. Fluid 564 may be a liquid, such as a hydraulic oil, or a gas, such as nitrogen. Of course, the advantage of gaseous fluids such as nitrogen is that there is no risk of contaminating the electronic component 540 should a leak or rupture of tube 568 occur. A hydraulic fluid may be preferred where higher pressures are desired and contamination is less of a concern. Tube 568 preferably will expand at least slightly at the desired pressures of fluid 564, thereby ensuring transmission of the increase in fluid pressure to beam 502. Fluid 564 may additionally be circulated through tube 568, thereby serving as a heat transfer fluid for cooling the contact structures 500. The available cooling capacity provided by a suitable cooling fluid may allow for transmission of higher currents through structure 500 than would otherwise be possible.

Membrane 562 preferably comprises a flexible material with sufficient strength for enclosing fluid 564 at the desired pressure levels, that is compatible with the electronic component 540, and is available as tubing with very small diameters. For example, polyamide, polyester, polyvinyl chloride, polyimide, or polyurethane micro-tubing, having external diameters slightly less than the beam clearance "c," may be used. The beam clearance "c" is typically between about 50 and 500 microns (about 2 and 20 mils), and tubing within this range is readily available. For example, precision medical micro-tubing may be used, such as is commercially available, for example, from Dunn Industries, Inc., of Manchester, N.H., with outer diameters as small as about 250 microns (10 mils).

In a related embodiment, an adjustable pressure device may be used to deflect the contact tip of a spring structure away from the mounting substrate and towards a mating component, as shown in FIG. 9C. When undeflected, structure 500 and compressible member 560 appear substantially the same as the corresponding structure and member shown in FIG. 9A. However, the compressible member 560 is configured to deflect the tip structure 530 away from substrate 516 and into contact with component 540, such as by increasing the pressure and volume of fluid 564 to inflate or expand the membrane 562. It is within the scope of the invention that the related configurations shown in FIGS. 9B and 9C may be provided by the same structure, and may be present at the same time at different locations (or at the same location at different times) on the same substrate. Such a situation may arise, for example, if the mating component 540 and the substrate 516 are not sufficiently parallel, or if either one is not sufficiently flat. For further example, a compressible member may be adjusted between the positions shown in FIGS. 9A–9C at the same location on a substrate, depending on the requirements of the application. FIGS. 9A–9C therefore exemplify a preferable range of compensation provided by compressible member 560.

Adjustable pressure devices, such as the fluid-filled tube 568 described above, are particularly advantageous for use with devices such as probe cards, that use large numbers of high-precision microelectronic spring contacts on a single device. Such devices tend to be relatively expensive to replace and repair, and at the same time, have hundreds or even thousands of relatively fragile contacts. Through normal wear and tear, or accidental events, the spring contacts may become misaligned. An adjustable pressure device can be used for compensate for a degree of misalignment or wear, and prolong the time between repair or replacement of the probe card. Also, even if the spring contacts remain in perfect alignment, the semiconductor device under test may have surface irregularities or contamination on its pads that prevent electrical contact. By applying additional contact pressure using an adjustable pressure device, electrical contact can be made despite the irregularities or contamination, thereby permitting the testing and approval of devices that would otherwise fail testing.

Various mechanisms may be used to make an adjustable pressure device for use with microelectronic spring structures according to the present invention. The fluid filled tube described above is but one of many possible ways, albeit a preferred way, to provide an adjustable pressure device for a microelectronic spring structure. Alternative adjustable pressure devices include, but are not limited to, other types of bladders, bellows, or balloons, piezoelectric devices, hydraulic devices, pneumatic devices, magnetic devices, electrostatic devices, mechanical devices, and electrical devices. While various devices are known in the art for positioning assemblies of spring contacts, such as probe cards, or tiles carrying spring contacts, adjustable pressure devices indisposed between the beam of a spring structure and its supporting substrate are not known in the art. To further illustrate the many and various means for applying an adjustable pressure to a beam component, an exemplary mechanical adjustable pressure device is illustrated by FIGS. 10A and 10B.

FIG. 10A shows a spring structure 500 in an undeflected position, with an adjustable pressure device comprising a rotating cam device 570. Cam device 570 comprises a cam 576 mounted to a drive rod 572, which is supported by a bearing block 574. Preferably, cam 576 can be rotated using drive rod 572 between a position not in contact with beam 502, as shown in FIG. 10A, and a position in contact with beam 502, as shown in FIG. 10B. Cam 576 may be made of a relatively soft, compressible material; or in the alternative, of a relatively rigid and incompressible material, so long as compatible with the beam material. Generally, a relatively slick polymeric material is preferred. Cam 576 preferably has an outer perimeter 578 disposed at a gradually increasing distance from the center of rotation of cam 576, i.e., perimeter 578 comprises a spiral. When beam 502 is deflected by contact between tip 530 and electronic component 540, an adjustable amount of pressure can be applied to beam 502 by rotating cam 576, e.g., in a counter-clockwise direction as shown in FIG. 10B, and applying the desired amount of torque to rod 572. Thus, cam device 570 is another example of an adjustable pressure device that may be mounted between the beam of a cantilever spring structure and the substrate to which it is attached. It should be apparent that the cam device 570 may be configured to drive the beam 502 upwards away from substrate 516 in a fashion similar to that shown in FIG. 9C, without departing from the scope of the invention.

Having thus described a preferred embodiment of microelectronic spring structure with additional protruding feature, it should be apparent to those skilled in the art that certain advantages of the within system have been achieved. It should also be appreciated that various modifications, adaptations, and alternative embodiments thereof may be made within the scope and spirit of the present invention. For example, a microelectronic spring structure has been illustrated, but it should be apparent that the inventive concepts described above would be equally applicable to other small structures, such as micro-electromechanical switches and relays, and purely mechanical springs. The invention is further defined by the following claims.

What is claimed is:

1. A microelectronic spring structure, comprising:
   a substrate;
   a beam;
   an elongate post component between said substrate and said beam, whereby said beam is spaced apart from and secured to said substrate, said post component comprise of a wire core coated with a structural material; and
   a protruding member mounted to said substrate, and disposed under said beam;
   wherein said microelectronic spring structure is reversibly deflectable between an undeflected position wherein the protruding member does not contact said beam, and a deflected position wherein said protruding member contacts said beam.

2. The microelectronic spring structure of claim 1, further comprising a tip structure for contacting a terminal of an electronic component, said tip structure mounted to and disposed above a surface of said beam opposite to said substrate.

3. The microelectronic spring structure of claim 2, wherein said tip structure is mounted to an end of said beam.

4. The microelectronic spring structure of claim 2, wherein said tip structure is positioned above all of said beam, relative to said substrate.

5. The microelectronic spring structure of claim 2, wherein said tip structure comprises a stand-off mounted to said beam, and a contact tip mounted to said stand-off.

6. The microelectronic spring structure of claim 1, wherein said beam is connected to a first terminal of an electronic component on said substrate, and said protruding member is connected to a second terminal of the electronic component on said substrate.

7. The microelectronic spring structure of claim 1, wherein said beam is connected to a terminal of an electronic component on said substrate, and said protruding member is not connected to any electronic component.

8. The microelectronic spring structure of claim 1, wherein said beam and said protruding member are connected to a shared terminal of an electronic component on said substrate.

9. The microelectronic spring structure of claim 1, wherein said beam is electrically isolated from said protruding member when said microelectronic spring structure is in the undeflected position.

10. The microelectronic spring structure of claim 1, wherein said beam is formed by a lithographic process on a sacrificial substrate.

11. The microelectronic spring structure of claim 1, wherein said beam is formed by lithographic process on a sacrificial layer.

12. The microelectronic spring structure of claim 1, wherein said post component comprises a column element.

13. The microelectronic spring structure of claim 1, wherein said post component comprises a group of column elements.

14. The microelectronic spring structure of claim 1, wherein said beam is straight and elongate.

15. The microelectronic spring structure of claim 1, wherein said beam is contoured.

16. The microelectronic spring structure of claim 1, wherein said protruding member comprises a wire bonded to said substrate.

17. The microelectronic spring structure of claim 16, wherein said protruding member further comprises a structural material coated over said wire.

18. The microelectronic spring structure of claim 1, wherein said post component is disposed under a middle portion of said beam.

19. The microelectronic spring structure of claim 18, further comprising an electronic device connected to said beam and to said substrate.

20. The microelectronic spring structure of claim 19, wherein said electronic device comprises a capacitor.

21. The microelectronic spring structure of claim 1, wherein said protruding member comprises a substantially compressible member.

22. The microelectronic spring structure of claim 21, wherein said protruding member comprises an elastic membrane enclosing a fluid.

23. The microelectronic spring structure of claim 1, wherein said protruding member comprises an adjustable pressure device.

24. The microelectronic spring structure of claim 23, wherein said protruding member comprises a rotating cam.

25. A microelectronic spring structure, comprising:
    a substrate;
    a beam, having a base portion, a cantilevered portion extending from said base portion,
    and a tip portion adjoining said cantilevered portion at an end thereof opposite to said
    base portion, said beam secured to said substrate at said base portion; and
    a protruding member mounted to said substrate, and disposed under said cantilevered portion of said beam, said protruding member comprising a wire core bonded to said substrate and encased in a structural material;
    wherein said microelectronic spring structure is reversibly deflectable between an undeflected position wherein the protruding member does not contact said beam, and a deflected position wherein said protruding member contacts said beam.

26. The microelectronic spring structure of claim 25, wherein said beam is electrically isolated from said protruding member when said microelectronic spring structure is in the undeflected position.

27. The microelectronic spring structure of claim 25, wherein said beam is formed by a lithographic process.

28. The microelectronic spring structure of claim 25, further comprising a tip structure for contacting a terminal of an electronic component, said tip structure mounted to said tip portion of said beam and positioned above all of said beam relative to said substrate.

29. The microelectronic spring structure of claim 25, wherein said protruding member is spaced apart from said tip portion, whereby said protruding member contacts said cantilevered portion of said beam at a position spaced apart from said tip portion when said microelectronic spring structure is in the deflected position.

30. The microelectronic spring structure of claim 25, wherein said beam is straight and elongate.

31. The microelectronic spring structure of claim 25, wherein said beam is contoured.

32. The microelectronic spring structure of claim 25, wherein said protruding member comprises a column, said column having a first end attached to said substrate, and a second end disposed under said beam above said substrate.

33. The microelectronic spring structure of claim 25, further comprising a post component securing said base portion to said substrate, whereby said base portion is spaced apart from and secured to said substrate.

34. The microelectronic spring structure of claim 25, wherein said cantilevered portion of said beam extends away from said substrate.

35. A microelectronic spring structure, comprising:
a substrate;
a beam, having a base portion, a cantilevered portion extending from said base portion, and a separately extending portion extending from said base portion in a direction different from said cantilever portion;
a post component mounted to said substrate and to said base portion from said beam, whereby said base portion of said beam is spaced apart from and secured to said substrate; and
an electronic device connected to said separately extending portion of said beam and to said substrate;
wherein said microelectronic spring structure is reversibly deflectable between an undeflected position wherein said cantilevered portion of said beam is substantially free of strain, and a deflected position wherein said cantilevered portion is deflected towards said substrate under the influence of an externally applied force.

36. The microelectronic spring structure of claim 35, wherein said beam further comprises a tip portion adjoining said cantilevered portion at an end thereof opposite to said base portion.

37. The microelectronic spring structure of claim 36, further comprising a tip structure for contacting an electronic component, said tip structure mounted to said tip portion of said beam.

38. The microelectronic spring structure of claim 35, wherein said electronic device comprises a capacitor.

39. The microelectronic spring structure of claim 35, wherein said beam is formed by a lithographic process on a sacrificial substrate.

40. The microelectronic spring structure of claim 35, wherein said post component comprises a column element, said column element comprised of a wire core coated with a structural material.

41. The microelectronic spring structure of claim 40, wherein said post component comprises a group of column elements.

42. The microelectronic spring structure of claim 41, wherein each column element of said group is comprised of a wire core coated with a structural material.

43. The microelectronic spring structure of claim 35, wherein said beam is straight and elongate.

44. The microelectronic spring structure of claim 35, wherein said beam is contoured.

45. A microelectronic spring structure, comprising:
a substrate;
a beam, having a base portion, and a cantilevered portion extending from said base portion, said beam secured to said substrate at said base portion; and
an adjustable device disposed under said beam providing a stop for said beam that is adjustable between at least two different positions,
wherein said microelectronic spring structure is reversibly deflectable between an undeflected position in which said beam is spaced from said adjustable device and a deflected position in which said beam is deflected into contact with said adjustable device.

46. The microelectronic spring structure of claim 45, wherein said adjustable device comprises an elastic membrane enclosing a fluid.

47. The microelectronic spring structure of claim 45, wherein said beam is formed by a lithographic process on a sacrificial substrate.

48. A microelectronic spring structure, comprising:
a substrate;
a beam, having a base portion, and a cantilevered portion extending from said base portion, said beam secured to said substrate at said base portion;
an adjustable device disposed under said beam providing a stop for said beam that is adjustable between at least two different positions; and
a post component securing said substrate to said base portion of said beam,
whereby said base portion of said beam is spaced apart from and secured to said substrate, and
wherein said post component comprises a column element, said column element comprised of a wire core coated with a structural material.

49. A microelectronic spring structure, comprising:
a substrate;
a beam, having a base portion, and a cantilevered portion extending from said base
portion, said beam secured to said substrate at said base portion; and a compressible protruding member disposed under said beam,
wherein said post component comprises a column element, said column element comprised of a wire core coated with a structural material.

* * * * *